United States Patent [19]

Higuchi

[11] Patent Number: 5,744,844
[45] Date of Patent: Apr. 28, 1998

[54] CMOS SRAM CELL

[75] Inventor: Tsuyoshi Higuchi, Kawasaki, Japan

[73] Assignee: Fujitsu Limited, Kawasaki, Japan

[21] Appl. No.: 752,631

[22] Filed: Nov. 19, 1996

[30] Foreign Application Priority Data

Mar. 29, 1996 [JP] Japan .................. 8-077459

[51] Int. Cl.$^6$ .................. H01L 29/76; H01L 27/11
[52] U.S. Cl. .................. 257/369; 257/368; 257/370; 257/903; 257/904; 365/189.11
[58] Field of Search .................. 257/208, 211, 257/369, 903, 368, 370, 904; 365/189.11

[56] References Cited

U.S. PATENT DOCUMENTS 5,334,863  8/1994  Ohkawa et al. .................. 257/69
5,422,840  6/1995  Naiki .................. 365/156

FOREIGN PATENT DOCUMENTS 6-61452  3/1994  Japan .................. 257/903
6-177354  6/1994  Japan .................. 257/903

*Primary Examiner*—Valencia Martin Wallace
*Attorney, Agent, or Firm*—Nikaido, Marmelstein, Murray & Oram LLP

[57] ABSTRACT

An outline of an SRAM cell is rectangular. The SRAM cell have nMOS transistors QN1 and QN3 in a nMOS region 13A being on one side of the longitudinal direction, nMOS transistors QN2 and QN4 in a nMOS region 13B being on the opposite side thereof, pMOS transistors QP1 and QP2 in a central region 12, and isolation regions 14A and 14B being between the regions 13A and 12 and between the regions 13B and 12 respectively. The pMOS transistors QP1 and QP2 are on the nMOS transistor QN1 side and on the nMOS transistor QN2 side respectively within the region 12. The direction of bit lines is perpendicular to the longitudinal direction and the word line is parallel to the longitudinal direction. The nMOS transistors QN1, QN4 and the pMOS transistor QP1 are placed on one side of the regions 13A, 13B and 12 respectively in the direction perpendicular to the longitudinal direction, whereas the nMOS transistors QN3 and QN2 and the pMOS transistor QP2 are placed on the opposite side thereof.

14 Claims, 11 Drawing Sheets

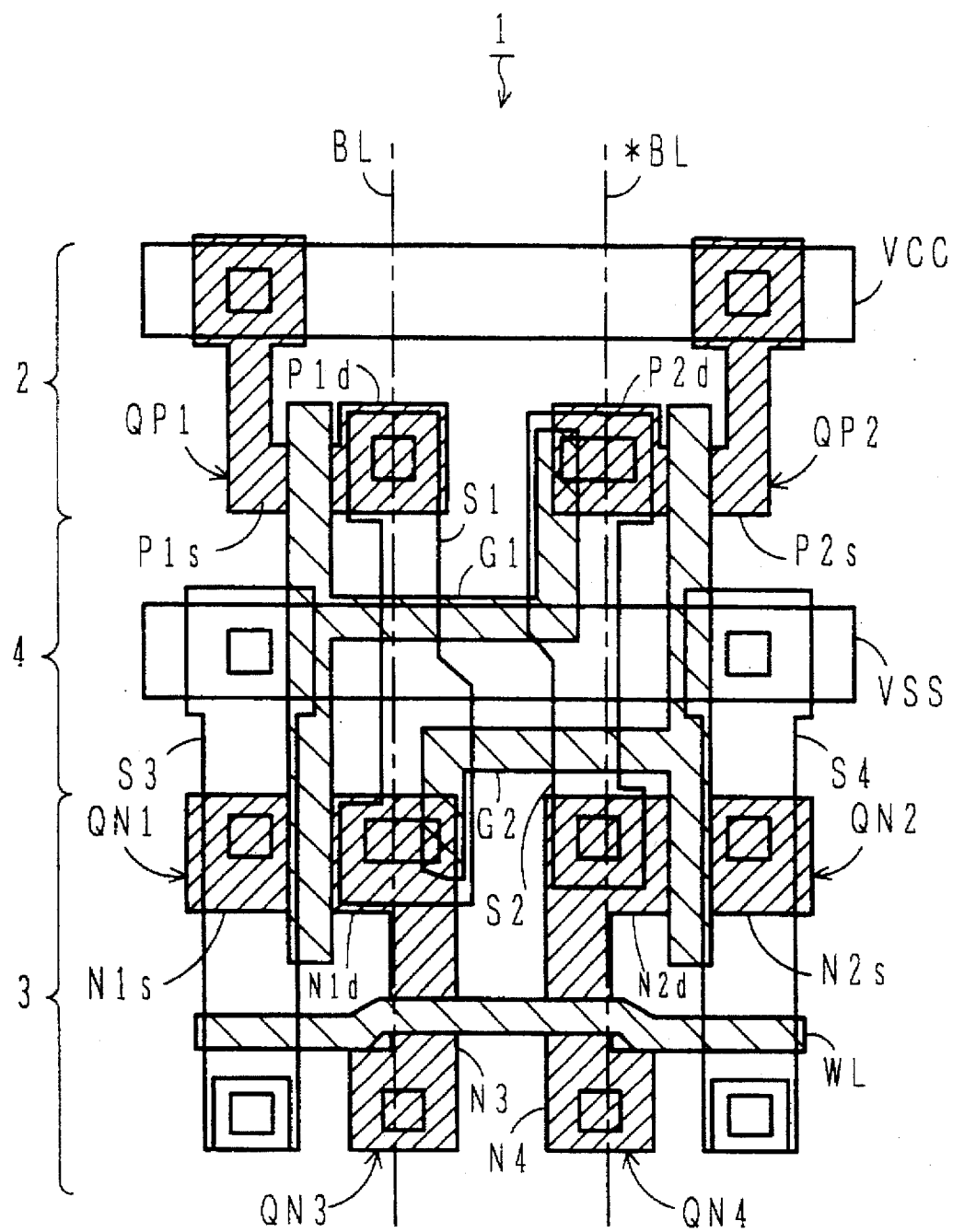

5,744,844

CMOS SRAM CELL

BACKGROUND OF THE INVENTION

1. Field of the Invention

The present invention relates to a semiconductor device having a CMOS SRAM cell.

2. Description of the Related Art

This type of SRAM, with its memory cells being the current-driven type employing a flip-flop instead of the charge-holding type such as DRAM, enables high speed access suitable for use as cache memory. Even higher speeds are required to support faster microprocessors.

FIG. 10 is a pattern diagram of an SRAM cell 1 in the prior art. FIG. 11(A) is a circuit diagram that corresponds to the layout pattern in FIG. 10 and FIG. 11(B) is a general circuit diagram that illustrates the connections in this circuit in an explicit manner.

In the SRAM cell 1, an isolation region 4 is formed between a pMOS region 2 and an nMOS region 3, and a word line WL, a reference potential supply line VSS and a source potential supply line VCC are arranged parallel to the isolation region 4. A pair of bit lines BL and *BL (* denotes complementary bit line), which are indicated only with their center lines, are arranged along a direction perpendicular to the word line WL. A CMOS invertor is constituted with a pMOS transistor QP1 and an nMOS transistor QN1, another CMOS invertor is constituted with a pMOS transistor QP2 and an nMOS transistor QN2 and these CMOS inverters are cross connected to constitute a flip-flop.

Metal wirings S1 to S4 and the source potential supply line VCC are formed in a metal wiring first layer, the reference potential supply line VSS is formed in a metal wiring second layer and the bit lines BL and *BL are formed in a metal wiring third layer.

A polysilicon wiring G1 includes gates of the pMOS transistor QP1 and the nMOS transistor QN1, with one end connected through a contact hole to a p-type semiconductor area P2d of the pMOS transistor QP2. A polysilicon wiring G2 includes gates of the pMOS transistor QP2 and the nMOS transistor QN2, with one end connected through a contact hole to an n-type semiconductor area N1d of the nMOS transistor QN1. A p-type semiconductor area P1d of the pMOS transistor QP1 and the n-type semiconductor area N1d of the nMOS transistor QN1 are connected through a contact holes to each other via the metal wiring S1, and the p-type semiconductor area P2d of the pMOS transistor QP2 and an n-type semiconductor area N2d of the nMOS transistor QN2 are connected through contact holes to each other via the metal wiring S2. In addition, an n-type semiconductor area N1s of the nMOS transistor QN1 is connected through contact holes to the reference potential supply line VSS via the metal wiring S3 and an n-type semiconductor area N2s of the nMOS transistor QN2 is connected through contact holes to the reference potential supply line VSS via the metal wiring S4.

When reading out data written in the SRAM cell 1, the bit lines BL and *BL are pre-charged to a specific potential (or not pre-charged at all) and then the word line WL is set to high to turn on nMOS transistors QN3 and QN4. This generates a potential difference between the bit line BL and the bit line *BL and, in order to prevent erroneous operation, when this potential difference reaches or exceeds a specific value it is amplified at a sense amplifier (not shown) and then taken out to the outside via a data bus.

In the SRAM cell 1 in the prior art, since the isolation region 4 is formed between the pMOS region 2 and the nMOS region 3 and the bit lines BL and *BL are arranged in the direction perpendicular to the isolation region 4, the bit lines BL and *BL are long in the SRAM cell array, increasing their capacity and resistance and restricting improvement in the speed at which data can be read out or written.

SUMMARY OF THE INVENTION

Accordingly, an object of the present invention is to provide a semiconductor device having a CMOS SRAM cell that is capable of speeding up access.

According to the 1st aspect of the present invention, there is provided a semiconductor device provided with a SRAM cell having a first nMOS transistor and a second nMOS transistor cross connected to each other, having a first pMOS transistor and a second pMOS transistor each connected between a drain of the first nMOS transistor and the second nMOS transistor respectively and a source potential supply line, and having a bit line, wherein the first nMOS transistor and the second nMOS transistor are arranged in a nMOS region, and the first pMOS transistor and the second pMOS transistor are arranged in a pMOS region; and the nMOS region and the pMOS region extend parallel to the bit line.

With the 1st aspect of the present invention, since the length of the bit lines is reduced in the layout described above compared to the prior art, reducing the capacity and resistance in the bit lines and achieving an advantage in that the access speed of the CMOS SRAM cell is improved compared to the prior art.

According to the 2nd aspect of the present invention, there is provided a semiconductor device provided with a SRAM cell comprising: a first nMOS region having first and third nMOS transistors; a second nMOS region having second and forth nMOS transistors; a pMOS region between the first and second nMOS regions, the pMOS region having first and second pMOS transistors; isolation regions between the first nMOS region and the pMOS region and between the second nMOS region and the pMOS region; first and second bit lines extending in a direction approximately perpendicular to a longitudinal direction extending from the first nMOS region to the second nMOS region; and a word line extending in the longitudinal direction; wherein the first and second nMOS transistors and the first and second pMOS transistors constitute a flip-flop for storing a bit data; the thrd nMOS transistor constitutes a first transfer gate connected between the first bit line and the flip-flop with a gate thereof connected with the word line; and the forth nMOS transistor constitutes a second transfer gate connected between the second bit line and the flip-flop with a gate thereof connected with the word line.

With the 2nd aspect of the present invention, since the length of the bit lines is reduced in the layout described above compared to the prior art, reducing the capacity and resistance in the bit lines and achieving an advantage in that the access speed of the CMOS SRAM cell is improved compared to the prior art.

In the 1st mode of the 2nd aspect of the present invention, the first pMOS transistor and the first nMOS transistor are connected in series between a source potential supply line and a reference potential supply line with a gate of the first pMOS transistor and a gate of the first nMOS transistor short-circuited to each other; the second pMOS transistor and the second nMOS transistor are connected in series between the source potential supply line and the reference potential supply line with a gate of the second pMOS transistor and a gate of the second nMOS transistor short-circuited to each other; the third nMOS transistor are connected between the first bit line and a drain of the first nMOS transistor; the forth nMOS transistor are connected between the second bit line and a drain of the second nMOS transistor; and the gate of the first pMOS transistor being connected to the drain of the second nMOS transistor and the gate of the second pMOS transistor being connected to the drain of the first nMOS transistor.

In the 2nd mode of the 2nd aspect of the present invention, the first and fourth nMOS transistors and the first pMOS transistor are each provided at one side of the first and second nMOS regions and the pMOS region in a direction approximately perpendicular to the longitudinal direction; and the third and second nMOS transistors and the second pMOS transistor are each provided at the other side of the first and second regions and the pMOS region in a direction approximately perpendicular to the longitudinal direction the direction.

With the 2nd mode, since the wiring that includes gates of a first nMOS transistor and a first pMOS transistor becomes approximately linear and the wiring that includes gates of a second nMOS transistor and a second pMOS transistor is becomes approximately linear, an advantage is achieved in that the region occupied by the CMOS SRAM cell is reduced.

In the 3rd mode of the 2nd aspect of the present invention, the first and third nMOS transistors are arranged in a direction perpendicular to the longitudinal direction and have a common n-type semiconductor area; and the second and forth nMOS transistors are arranged in a direction approximately perpendicular to the longitudinal direction and have a common n-type semiconductor area.

With the 3rd mode, since the first nMOS region and the second nMOS region become relatively small, an advantage is achieved in that the region occupied by the CMOS SRAM cell is reduced.

In the 4th mode of the 2nd aspect of the present invention, the first pMOS transistor is placed within the pMOS region toward the first nMOS region; and the second pMOS transistor is placed within the pMOS region toward the second nMOS region.

With the 4th mode, since the areas between closely coupled transistors face opposite each other, the length of the wiring between the elements within the CMOS SRAM cell is reduced, thereby achieving an advantage in that the region occupied by the CMOS SRAM cell is reduced.

In the 5th mode of the 2nd aspect of the present invention, a gate of the first nMOS transistor and a gate of the first pMOS transistor are portions of a first polysilicon wiring with the first polysilicon wiring connected through a contact hole to the drain of the second pMOS transistor; and a gate of the second nMOS transistor and a gate of the second pMOS transistor are portions of a second polysilicon wiring with the second polysilicon wiring connected through a contact hole to the drain of the first pMOS transistor.

With the 5th mode, an advantage is achieved in that polysilicon wiring can be achieved efficiently.

In the 6th mode of the 2nd aspect of the present invention, an outline of the CMOS SRAM cell is a rectangular shape.

Although the outline of the CMOS SRAM cell in the 2nd aspect of the present invention is not limited to a rectangular shape, since the rectangular shape is advantageous in regard to reducing the length of the bit lines, an advantage is achieved in the 6th mode, in that the length of the bit lines is further reduced.

In the 7th mode of the 2nd aspect of the present invention, the source potential supply line is arranged over the pMOS region along a direction approximately perpendicular to the longitudinal direction; and the reference potential supply line is arranged along each side, which direction is perpendicular to the longitudinal direction, of the rectangular shape.

With the 7th mode according to the present invention, since the source potential supply line runs in the direction perpendicular to the word line, when one word line is selected in the SRAM, voltages are supplied from each pair of power supply lines to each SRAM cell present along this word line, achieving an advantage the same as that achieved when the width of the power supply lines are increased and, consequently, fluctuations of the source voltage and reference voltage are reduced compared to the prior art, to achieve an improvement in noise resistance.

In the 8th mode of the 2nd aspect of the present invention, the CMOS SRAM cell is symmetric with respect to a central point thereof.

With the 8th mode, an advantage is achieved in that, because of the symmetry, exposure pattern processing is simplified. In addition, since the shapes of the first and second CMOS inverters are identical, operation is stabilized.

In the 9th mode of the 2nd aspect of the present invention, it comprises a memory cell array and a peripheral circuit for performing data write and read for the memory cell array, wherein the memory cell array comprises CMOS SRAM cells laid out in a lattice; and each of the CMOS SRAM cells includes: a first nMOS region having first and third nMOS transistors; a second nMOS region having second and forth nMOS transistors; a pMOS region between the first and second nMOS regions, the pMOS region having first and second pMOS transistors; isolation regions between the first nMOS region and the pMOS region and between the second nMOS region and the pMOS region; first and second bit lines extending in a direction approximately perpendicular to a longitudinal direction extending from the first nMOS region to the second nMOS region; and a word line extending in the longitudinal direction; wherein the first and second nMOS transistors and the first and second pMOS transistors constitute a flip-flop for storing a bit data; the third nMOS transistor constitutes a first transfer gate connected between the first bit line and the flip-flop with a gate thereof connected with the word line; and the forth nMOS transistor constitutes a second transfer gate connected between the second bit line and the flip-flop with a gate thereof connected with the word line.

In the 10th mode of the 2nd aspect of the present invention, an outline of each the CMOS SRAM cell is a rectangular shape; and each of the CMOS SRAM cells is symmetric with respect to a central point thereof.

With the 10th mode, due to the line symmetry, a blank area in one of CMOS SRAM cells that are adjacent in the direction of the bit lines can be effectively utilized as a word line connection area for the other CMOS SRAM cell, and an advantage is achieved in that higher integration of a CMOS SRAM cell array becomes possible.

In the 11th mode of the 2nd aspect of the present invention, the CMOS SRAM cells include a first-type one and a second-type one with a same size of outlines thereof; the first-type one and the second-type one are arranged alternately in the longitudinal direction and in a direction perpendicular to the longitudinal direction; and the first-type one and the second-type one are approximately symmetric with respect to a boundary line between the first-type one and the second-type one adjacent to each other.

With the 11th mode, since the data lines are connected to the bit lines at each of a plurality of CMOS SRAM cells arranged in the direction of the bit lines and the data lines are connected to data bus lines arranged between CMOS SRAM cell blocks, it is possible to increase the number of memory cells in the direction perpendicular to the data bus lines compared to the prior art, thereby reducing the length of the data bus lines compared to the prior art and, consequently, the region occupied by the data bus lines are reduced.

In the 12th mode of the 2nd aspect of the present invention, a gate of the third nMOS transistor of the first-type one is connected to the word line over the first-type one; a gate of the fourth nMOS transistor of the second-type one is connected via a gate line to the gate of the third nMOS transistor of adjacent the first-type one; a gate of the forth nMOS transistor of the first-type one is connected to the word line over the first-type one; and a gate of the third nMOS transistor of the second-type one is connected via a gate line to the gate of the fourth nMOS transistor of adjacent the first-type one.

In the 13th mode of the 2nd aspect of the present invention, first and second data lines parallel to the first and second bit lines respectively are arranged in each of the CMOS SRAM cells; the first and second data lines are connected to the first and second bit lines respectively in each of a plurality of the CMOS SRAM cells provided in a direction of the bit line; and the first and second data line are connected to data bus lines provided between CMOS SRAM cell blocks.

BRIEF DESCRIPTION OF THE DRAWINGS

FIG. 10 is a pattern diagram of an SRAM cell in the prior art; and

BRIEF DESCRIPTION OF THE PREFERRED EMBODIMENT

Figure 1:
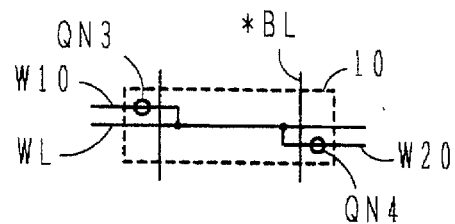
FIG. 1(A) is a schematic pattern diagram of a first-type SRAM cell.
FIG. 1(B) is a schematic pattern diagram of a second-type SRAM cell and FIG. 1(C) is a schematic pattern diagram of a cell array in which first-type and second-type SRAM cells are arranged alternately.
Figure 1:
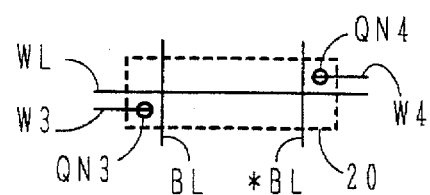
Figure 1:
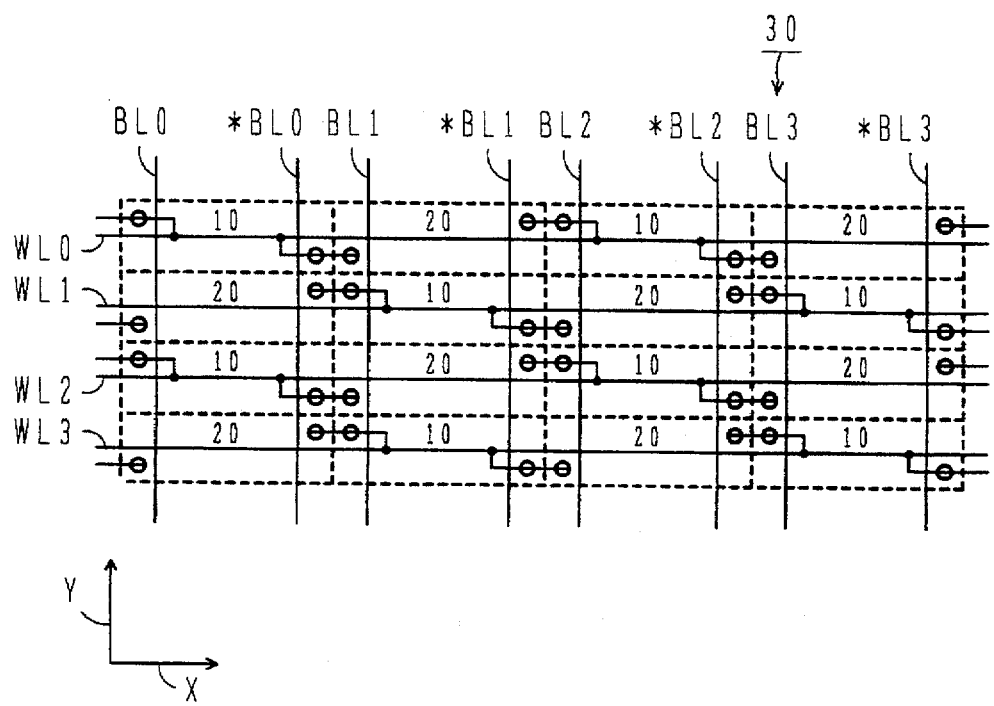

Referring now to the drawings, preferred embodiment of the present invention is described below.

FIG. 1(A) shows a schematic pattern of a first-type SRAM cell 10 and FIG. 1(B) shows a schematic pattern of a second-type SRAM cell 20. Although, as circuits, both the first-type SRAM cell 10 and the second-type SRAM cell 20 are identical to the circuit in the prior art shown in FIG. 11(B), its layout pattern is different from that shown in FIG. 10, with a pair of bit lines BL and *BL (* denotes complementary bit line) arranged parallel to the shorter side of the rectangular outline of the SRAM cell. A word line WL runs parallel to the longer side of this rectangular outline.

Figure 11A:
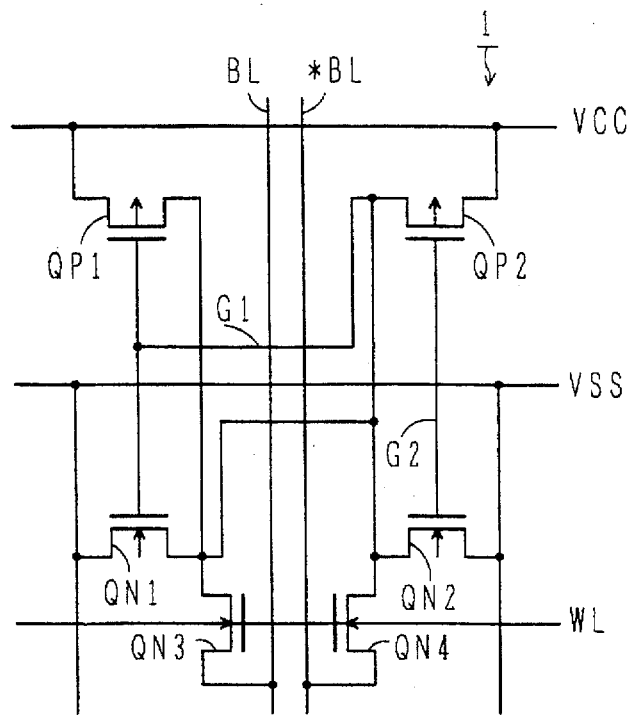
FIG. 11(A) is a circuit diagram that corresponds to the layout pattern shown in FIG. 10
Figure 11B:
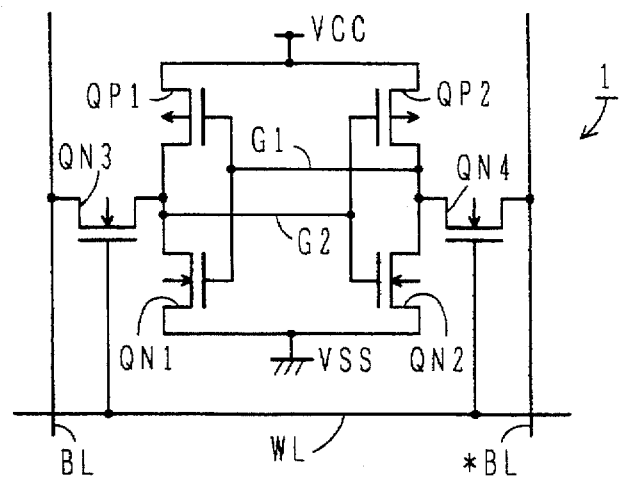
FIG. 11(B) is a general circuit diagram illustrating the connections in FIG. 11(A) in an explicit manner.

In FIGS. 2 to 7, the same reference characters are assigned to elements corresponding to the elements shown in FIGS. 10 and 11 even though the pattern forms are different, in order to facilitate co-relating. Also, the same reference characters are assigned to elements that correspond to each other in the first-type SRAM cell 10 and the second-type SRAM cell 20.

Figure 2A:
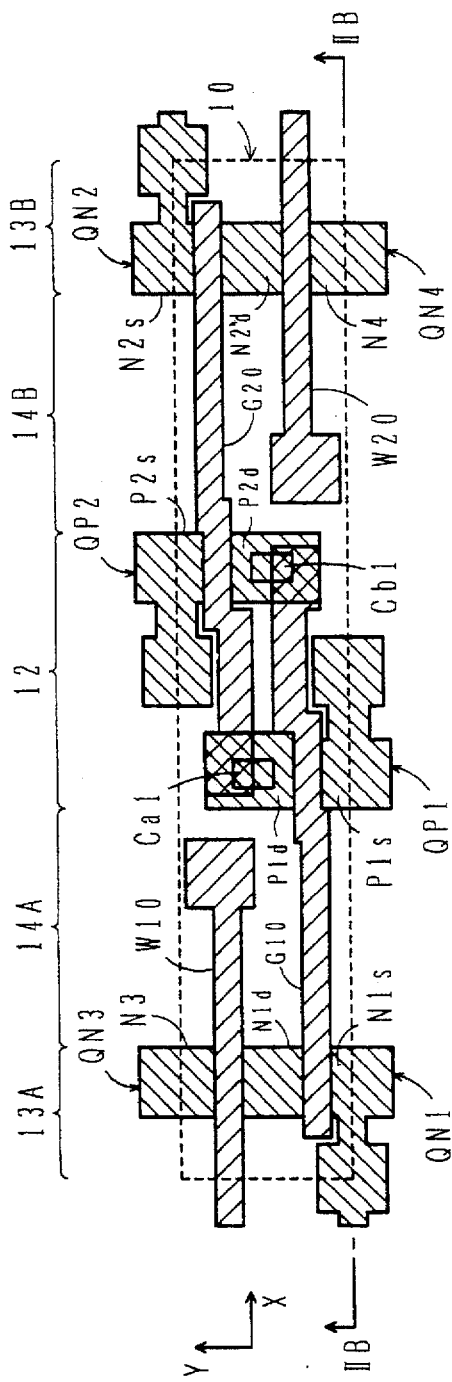
FIG. 2(A) is a pattern diagram showing semiconductor substrate portion and polysilicon wirings in the first-type SRAM cell and FIG. 2(B) is a cross section through line IIB__IIB in FIG. 2(A)
Figure 2B:
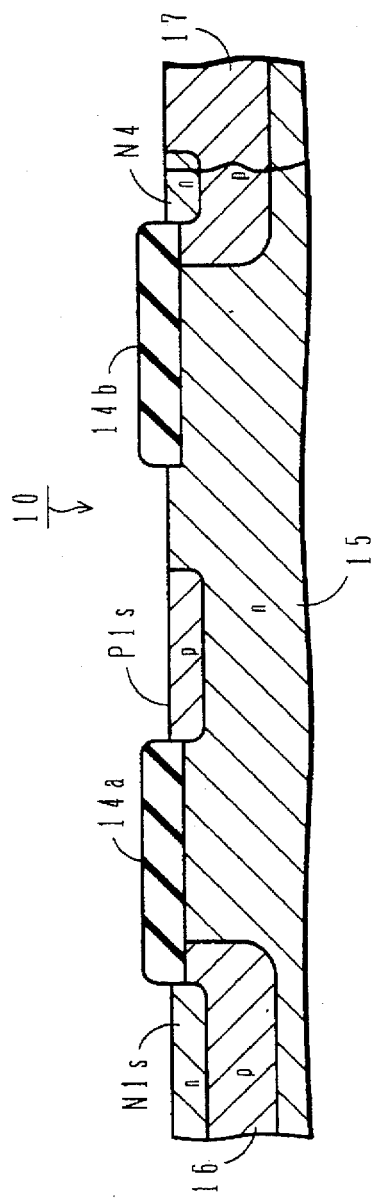
Figure 3A:
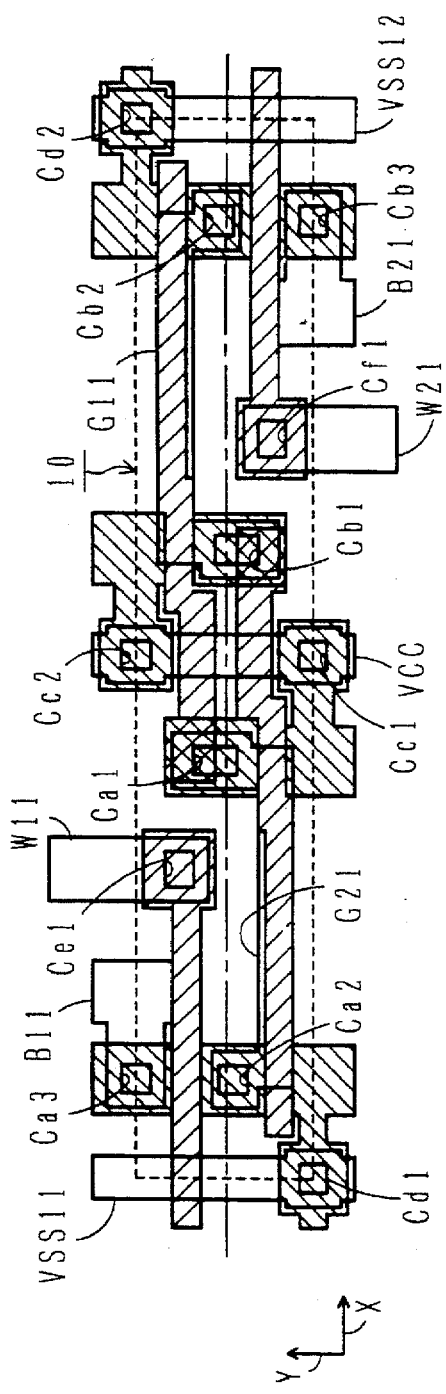
FIG. 3(A) is a pattern diagram obtained by superimposing the wiring pattern in a metal wiring first layer over the pattern shown in FIG. 2(A) and FIG. 3(B) is a pattern diagram obtained by superimposing a wiring pattern in a metal wiring second layer over the pattern shown in FIG. 3(A)
Figure 3B:
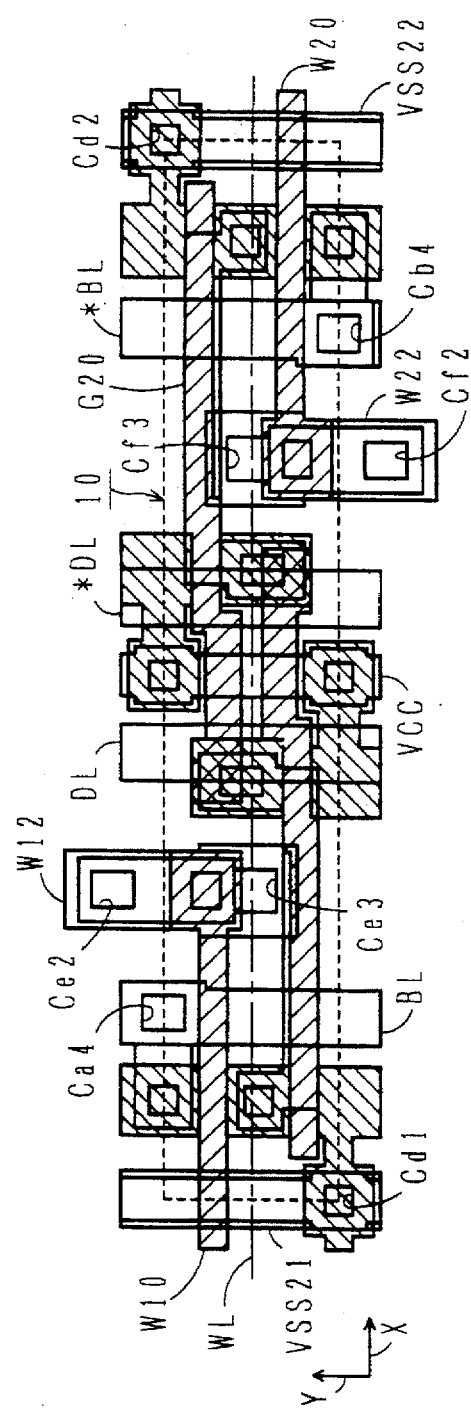
Figure 6A:
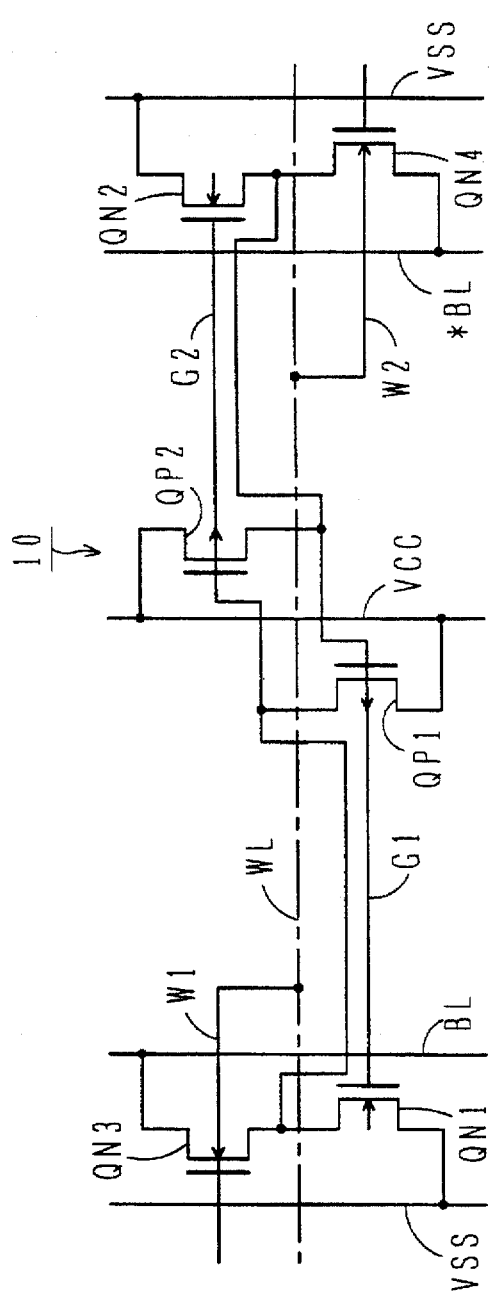
FIG. 6(A) is a circuit diagram that corresponds to the layout pattern shown in FIG. 3(B) and FIG. 6(B) is a circuit diagram that corresponds to the layout pattern shown in FIG. 4.
Figure 6B:
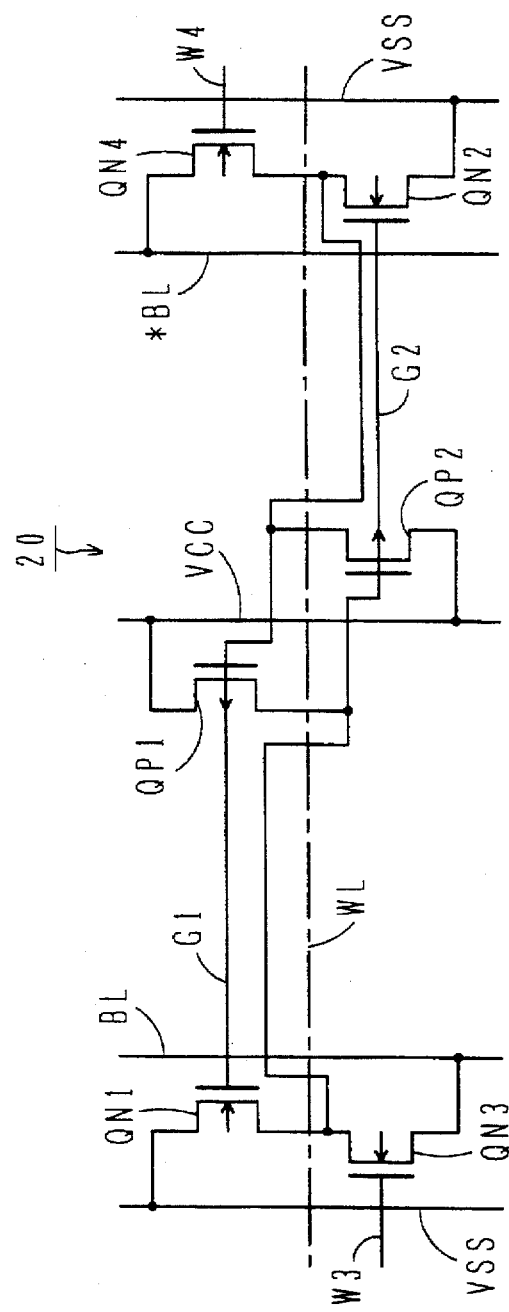
Figure 7:
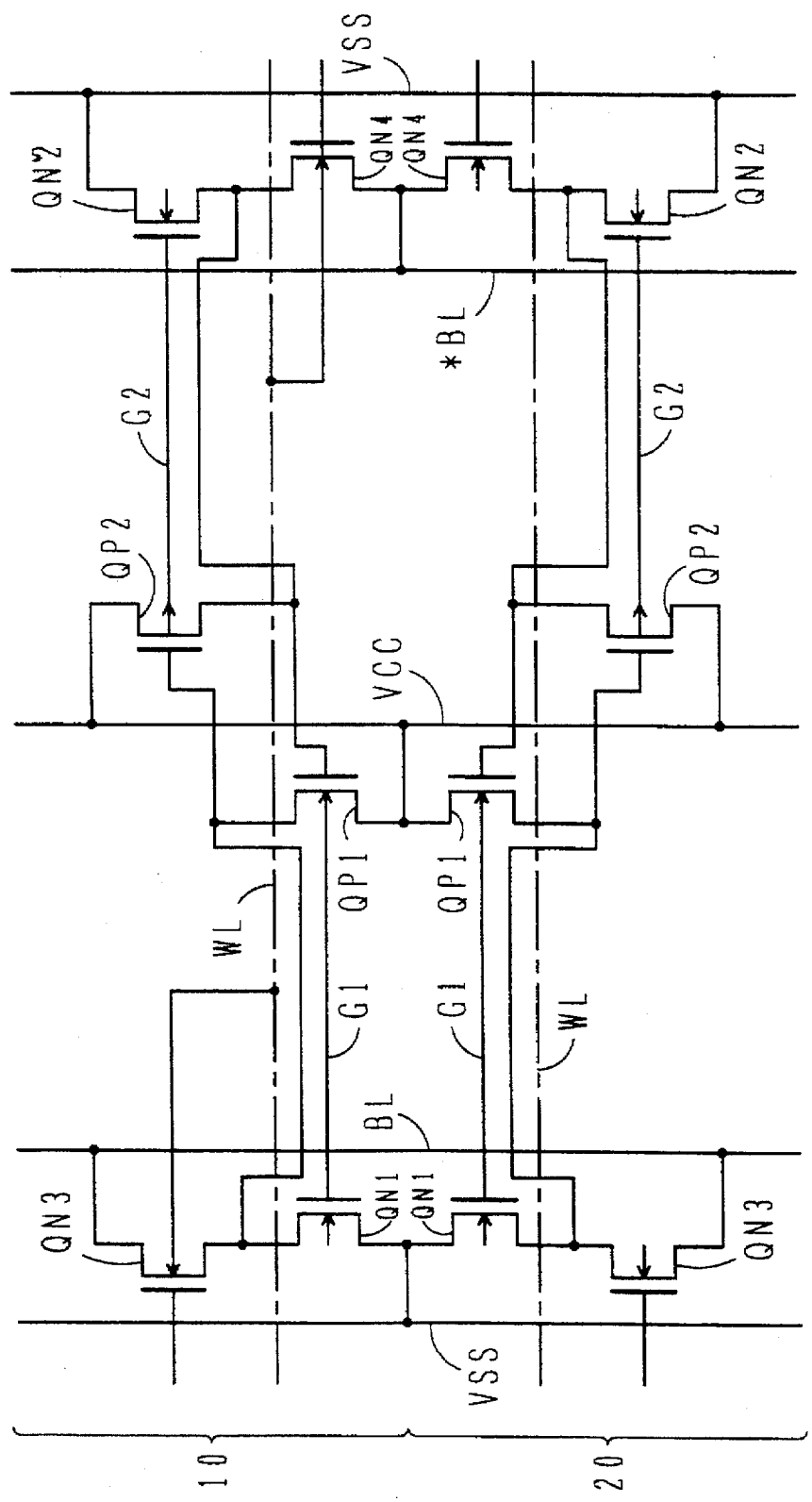
FIG. 7 is a circuit diagram that corresponds to the layout pattern shown in FIG. 5.

FIG. 2(A) is a pattern diagram showing semiconductor substrate portion and polysilicon wirings in the first-type SRAM cell and FIG. 2(B) is a cross section through line IIB__IIB in FIG. 2(A). FIG. 3 is a pattern diagram obtained by superimposing the wiring pattern in a metal wiring first layer over the pattern shown in FIG. 2(A). FIG. 3(B) is a pattern diagram obtained by superimposing the wiring pattern in a metal wiring second layer over the pattern shown in FIG. 3(A). FIG. 6(A) is a circuit diagram corresponding to the layout pattern shown in FIG. 3(B). The directions that run parallel to the long sides and to the short sides of the first-type SRAM cell 10 are set as direction X and direction Y respectively in the figures.

In FIG. 2(A), in relation to FIG. 10, a pMOS region 12 corresponds to a pMOS region 2, and nMOS regions 13A and 13B correspond to an nMOS region 3 and isolation regions 14A and 14B correspond to an isolation region 4. Namely, in direction X of the first-type SRAM cell 10, the pMOS region 12 is arranged at the center, the nMOS regions 13A and 13B are arranged at one and another ends, the isolation regions 14A and 14B respectively are formed between the pMOS region 12 and the nMOS region 13A and between the pMOS region 12 and the nMOS region 13B. The nMOS regions 13A and 13B are respectively formed, as shown in FIG. 2(B), within p-wells 16 and 17 of an n-type semiconductor substrate 15. In contrast, the pMOS region 12 is formed at a surface portion of the n-type semiconductor substrate 15. Field oxide films 14a and 14b are part of the isolation regions 14A and 14B respectively.

A pMOS transistor QP1 and a pMOS transistor QP2 are formed in the pMOS region 12, an nMOS transistor QN1 and an nMOS transistor QN3 are formed in the nMOS region 13A and an nMOS transistor QN2 and a nMOS transistor QN4 are formed in the nMOS region 13B. The pMOS transistor QP1 and the nMOS transistor QN1 constitute one of the CMOS inverters of a flip-flop and the pMOS transistor QP2 and the nMOS transistor QN2 constitute the other other CMOS invertor of the flip-flop. The nMOS transistors QN3 and QN4 are both transfer gates.

The pattern shown in FIG. 2(A) is symmetric with respect to the central point of the first-type SRAM cell 10. This simplifies the processing of exposure pattern data. In the same figure, the characters s and d in the reference characters indicate source areas and drain areas respectively, P or N at the beginning of the reference characters indicate a p-type semiconductor areas and n-type semiconductor areas respectively, and the numerals in the middle of the reference characters correspond to the numerals in the reference characters assigned to the transistors.

The pMOS transistor QP1 is provided with p-type semiconductor areas P1s and P1d, a channel area between them and a gate provided over the channel area via a gate oxide film, with this gate constituting part of a polysilicon wiring G10. Gates of the pMOS transistor QP2, the nMOS transistors QN1, QN2, QN3 and QN4 respectively constitute part of polysilicon wirings G20, G10, W10 and W20. P-type semiconductor areas P2s and P2d of the pMOS transistor QP2 respectively correspond to the p-type semiconductor areas P1s and P1d of the pMOS transistor QP1. The nMOS transistor QN1 is provided with n-type semiconductor areas N1s and N1d, a channel area between them and a gate provided over the channel area via a gate oxide film. The nMOS transistors QN2 to QN4 are identical to the nMOS transistor QN1.

Since the nMOS transistor QN1 and the pMOS transistor QP1 are provided on one side in direction Y, the polysilicon wiring G10 extends almost linearly and, likewise, since the nMOS transistor QN2 and the pMOS transistor QP2 are provided on the other side in direction Y, the poly-silicon wiring G20 extends almost linearly. The nMOS transistor QN1 and the nMOS transistor QN3, which share the n-type semiconductor area N1d, are provided in direction Y and the nMOS transistor QN2 and the nMOS transistor QN4, which share the n-type semiconductor area N2d, are provided in direction Y. In addition, the pMOS transistors QP1 and QP2 are respectively provided on the side of the nMOS transistors QN1 and QN2 in the pMOS region 12. These factors contribute to reducing the Y direction width of the first-type SRAM cell 10 and to reducing the region occupied by the first-type SRAM cell 10.

The reference characters assigned in FIG. 2(A) are omitted in FIG. 3(A) in order to avoid complicating the illustration. The pattern shown in FIG. 3(A) is symmetric with respect to the central point of the first-type SRAM cell 10, as in the case of the pattern shown in FIG. 2(A).

Metal wirings G11 and G21 are used to achieve cross connection between the two inverters described above. Namely, one end of the polysilicon wiring G20 and n-type semiconductor area N1d are connected through contact holes Ca1 and Ca2 via the metal wiring G21, and one end of the polysilicon wiring G10 and n-type semiconductor area N2d are connected through the contact holes Cb1 and Cb2 via the metal wiring G11.

As for the power supply lines, a source potential supply line VCC is provided at the center, in the X direction, of the first SRAM cell 10 and reference potential supply lines VSS 11 and VSS 12 are provided at one end and the other end, in the X direction, of the first SRAM cell 10. These source wirings VCC, VSS11 and VSS12 all extend parallel to direction Y. The source potential supply line VCC is connected through contact holes Cc1 and Cc2 respectively to to the p-type semiconductor areas P1s and P2s below. Since both the reference potential supply lines VSS11 and VSS12 are shared with adjacent SRAM cells, their center lines align with the dotted boundary line of the first-type SRAM cell 10. The reference potential supply line VSS11 is connected through a contact hole Cd1 to an n-type semiconductor area N1s below and the reference potential supply line VSS12 is connected through a contact hole Cd2 to an n-type semiconductor area N2s below.

Metal wirings B11, B21, W11 and W21 are all intermediate wirings for connecting the lower layer and the upper layer. The metal wiring B11 is connected through a contact hole Ca3 to an n-type semiconductor area N3 below, the metal wiring B21 is connected through a contact hole Cb3 to an n-type semiconductor area N4 below, the metal wiring W11 is connected through a contact hole Ce1 to the polysilicon wiring W10 below and the metal wiring W21 is connected through a contact hole Cf1 to the polysilicon wiring W20 below.

In FIG. 3(B), the reference characters assigned in FIGS. 2(A) and 3(A) are omitted to avoid complicating the illustration. The pattern shown in FIG. 3(B) is symmetric with respect to the central point of the first-type SRAM cell 10 as in the case of the pattern shown in FIG. 3(A).

In order to improve the degree of integration by reducing the wiring width, reference potential supply lines VSS21 and VSS22 are provided through insulating layer on the reference potential supply lines VSS11 and VSS12 respectively. The pair of bit lines BL and *BL are provided close to the reference potential supply lines VSS21 and VSS22 respectively, running parallel to them so that they can be shielded by the reference potential supply lines VSS21 and VSS22 to reduce noise. The bit line BL is connected through a contact hole Ca4 to the metal wiring B11 below and the bit line *BL is connected through a contact hole Cb4 to the metal wiring B21 below. In addition, data lines DL and *DL are provided on the two sides of the source potential supply line VCC along it. It is to be noted that the data lines DL and *DL are omitted in FIGS. 6(A), 6(B) and 7.

The metal wirings W12 and W22 are both intermediate wiring for connecting the lower layer and the upper layer. The metal wiring W12 is connected through a contact hole Ce2 to the metal wiring W11 below and is connected through a contact hole Ce3 to the word line WL above. The word line WL is in a third wiring layer and only its center line is shown in order to avoid complicating the illustration of the pattern. Likewise, the metal wiring W22 is connected through a contact hole Cf2 to the metal wiring W21 below and is connected through a contact hole Cf3 to the word line WL above.

Figure 4:
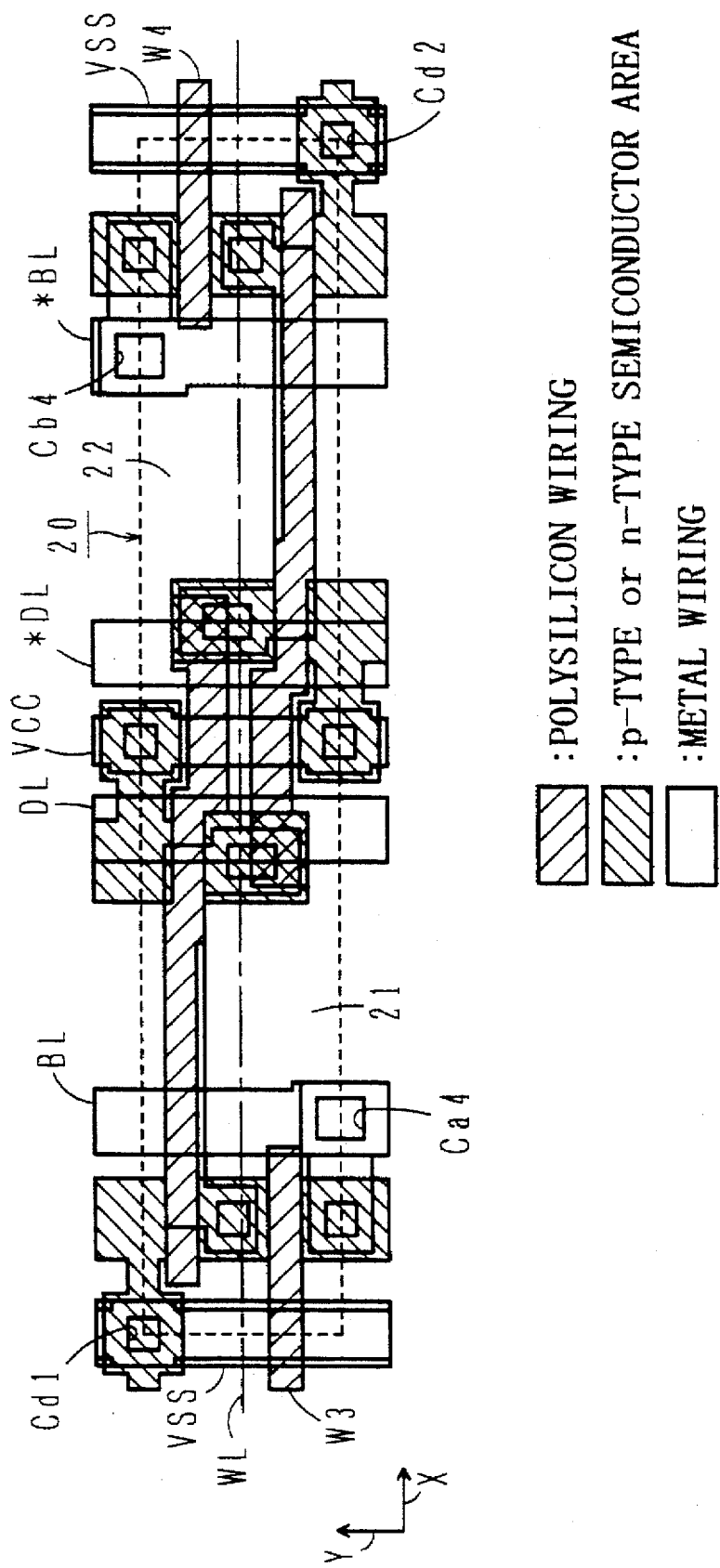
FIG. 4 is a pattern diagram of the second-type SRAM cell corresponding to FIG. 3(B)

FIG. 4 is a pattern diagram of a second-type SRAM cell and this pattern is got by converting the pattern of the first-type SRAM cell 10 shown in FIG. 3(B) symmetric with respect to the center line in direction X (the center line of WL), removing the metal wirings W12, W22, W11 and W21 and also removing the end portions of the polysilicon wirings W10 and W20 at the side of the cell center. This symmetry results in efficient utilization of blank areas 21 and 22 in their relation to the first-type SRAM cell 10, achieving a contracted pattern.

Figure 5:
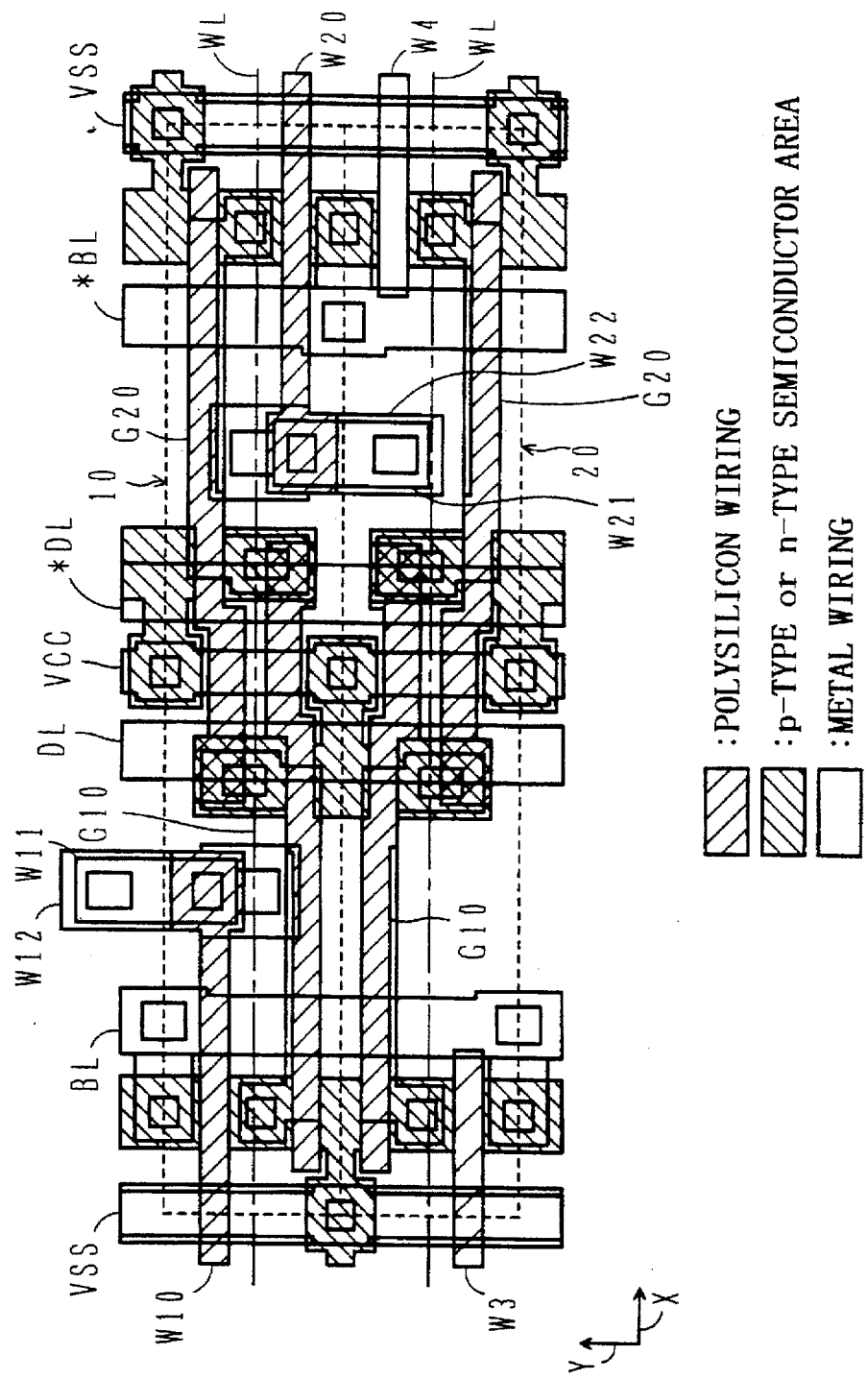
FIG. 5 is a pattern diagram obtained when the first-type SRAM cell of FIG. 3(B) and the second-type SRAM cell of FIG. 4 are arranged in the direction of the bit lines in parallel.

Namely, by arranging the first-type SRAM cell 10 and the second-type SRAM cell 20 parallel to each other as shown in FIG. 5 and by aligning them at the dotted line that indicates the cell boundary, the metal wirings W21 and W22 of FIG. 3(B) are located into the blank area 22 of FIG. 4. By arranging a first-type SRAM cell 10 in parallel in the lower space of FIG. 5, the metal wirings W11 and W12 of the first-type SRAM cell are located into the blank area 21 of FIG. 4. Polysilicon wirings W3 and W4 of the second-type SRAM cell 20 are connected to the word line WL in the following manner. First-type SRAM cells 10 are arranged adjacent to a second-type SRAM cell 20 at both sides in the longitudinal direction of the second-type SRAM cell 20. With this, the polysilicon wiring W20 of the first SRAM cells 10 are connected to the polysilicon wiring W3 of the second SRAM cell 20, and the polysilicon wiring W3 is connected via the polysilicon wirings W20 to the word lines WL of the first-type SRAM cell 10. Likewise, the polysilicon wiring W10 of the first SRAM cells 10 are connected to the polysilicon wiring W4 of the second SRAM cell 20, and the polysilicon wiring W4 is connected via the polysilicon wirings W10 to the word lines WL of the first-type SRAM cell 10.

This layout and the connections of the word lines WL are shown in FIG. 1(C).

In a cell array 30, the first-type SRAM cells 10 and the second-type SRAM cells 20 are arranged in the form of a lattice so that they are adjacent to each other alternately in both directions X and Y with their boundary lines aligned. This drawing makes it possible to easily understand the connections of polysilicon wirings W3 and W4 of the second SRAM cells 20 to the word lines WL. BL0 to BL3 and *BL0 to *BL3 indicate bit lines and WL0 to WL3 indicate word lines.

In this embodiment, as shown in FIG. 2(A), the pMOS region 12 is provided between the nMOS region 13A and the nMOS region 13B, and the bit lines are arranged in the direction perpendicular to the direction from the nMOS region 13A to the nMOS region 13B. Consequently, the length of the bit lines for each SRAM cell can be reduced compared to the prior art and this contributes to a reduction in the capacity and resistance of the bit lines to improve the access speed of the semiconductor device compared to the prior art.

Moreover, in FIG. 10, since the power supply lines, or the source potential supply line VCC and the reference potential supply line VSS, run parallel to the word line WL in the SRAM cell, when one word line WL is selected in the SRAM, voltages from a pair of a source potential supply line VCC and a reference potential supply line VSS are supplied to a row of the SRAM cells which are along the selected word line WL. In contrast, in FIG. 1(C), since the power supply lines are arranged along the direction perpendicular to the word lines, when one word line is selected, each SRAM cell which is along this word line receives voltages from a different pair of the power supply lines, achieving an advantage similar to that achieved when increasing the width of the power supply line and the fluctuation of the source voltage is reduced compared to the prior art to improve noise resistance.

Figure 8A:
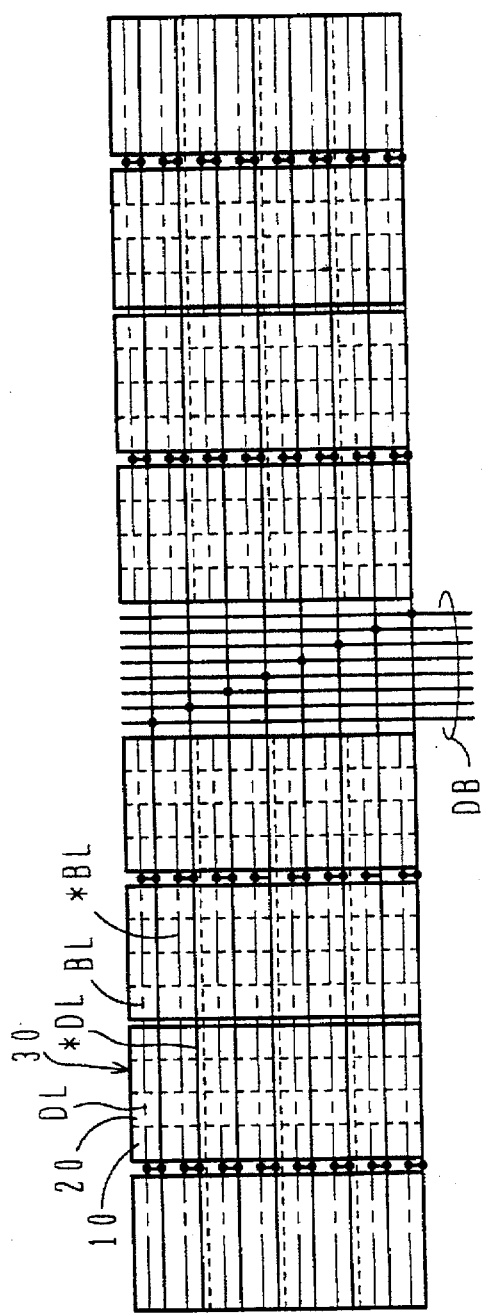
FIG. 8(A) shows the layout of a data bus in the SRAM cell array in this embodiment.
Figure 8B:
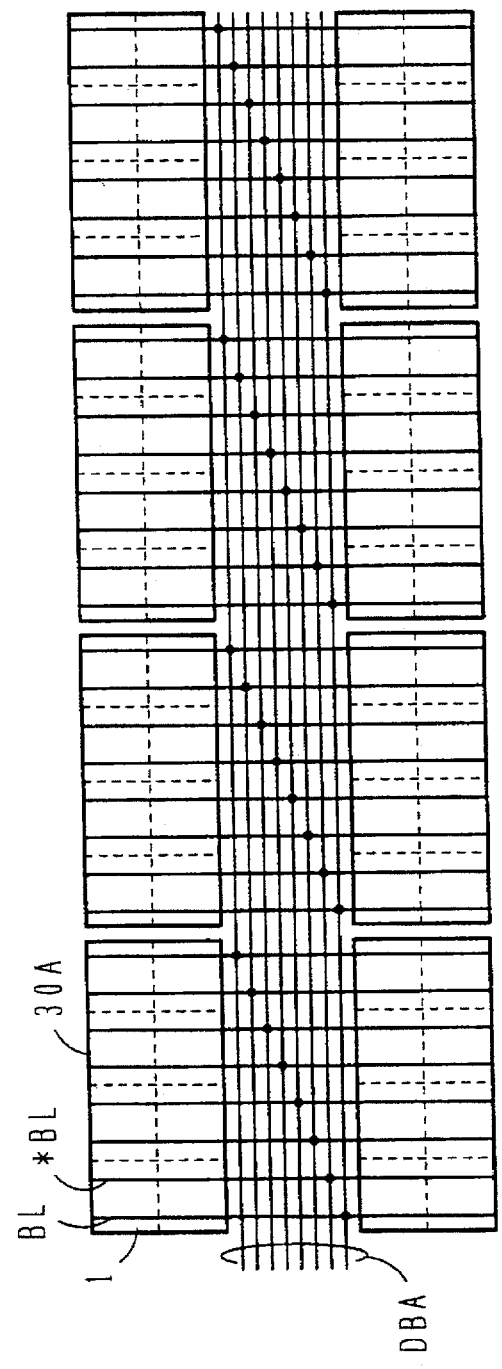
FIG. 8(B) shows the layout of a data bus in an SRAM cell array in the prior art.

FIG. 8(A) shows the layout of a data bus DB in the SRAM cell array in this embodiment and FIG. 8(B) shows the layout of a data bus DBA in an SRAM cell in the prior art. In these FIGS. 8(A) and 8(B), Dotted lines indicate SRAM cell boundary.

In the prior art, the bit lines are connected to the data bus DBA at one end side of a cell array block 30A, whereas in this embodiment, the bit lines BL and *BL are connected to the data lines DL and * DL respectively at the outside of a cell array block 30 for every two cell array blocks. The loads of the bit lines BL and *BL are relatively large, because these lines BL and *BL are connected to the transfer gates in each SRAM cell, while those of the data lines DL and *DL are relatively small. Consequently, the number of memory cells present along the direction perpendicular to the data bus DB can be increased compared to the prior art and this contributes to a reduction of the length of the data bus DB compared to the prior art. This, in turn, results in reduced area occupied by the data bus DB, increasing the storage capacity compared to the prior art. As shown in FIG. 3(B), since the data lines DL and *DL are arranged in a blank portion of the pMOS region 12 no increase in the area of the cells on account of the data lines DL and *DL is required.

Although preferred embodiment of the present invention has been described, it is to be understood that the invention is not limited thereto and that various changes and modifications may be made without departing from the spirit and scope of the invention.

Figure 9:
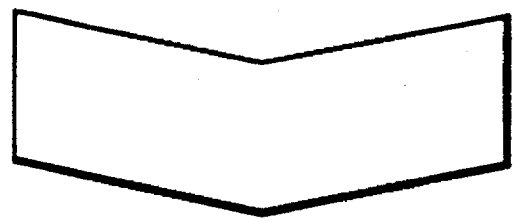
FIGS. 9(A) to 9(C) are outline views of cells that are variations of the SRAM cell.
Figure 9:
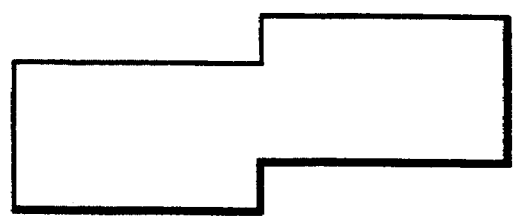
Figure 9:
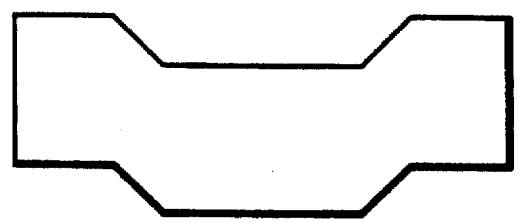

For instance, while a desirable structure with the outline shape of each cell being rectangular has been explained in reference to this embodiment, the advantages of the present invention can be achieved even when the outline shape of the SRAM cell is not rectangular, and the SRAM cell may take outline shapes such as those shown in FIGS. 9(A) to 9(C), for instance.

In addition, by employing a local interconnection under the contact holes, the length of the cell in direction X is reduced with the bit line BL placed over the nMOS transistors QN1 and QN3, which are arranged near the reference potential supply line VSS21.

Furthermore, in FIG. 3(A), although the metal wiring G21, the polysilicon wiring G20 and the p-type semiconductor area P1$d$ are connected to each other at the contact hole Ca1, connections between the metal wiring G21 and the polysilicon wiring G20 and between the polysilicon wiring G20 and the p-type semiconductor area P1$d$ may be achieved by passing through contact holes at different positions, as in the case of the contact holes Ce2 and Ce3, to achieve a lower uneven profile in the wiring layers and an improvement in reliability.

In addition, it goes without saying that the present invention may take a structure that is not provided with the data lines DL and *DL.

What is claimed is:

1. A semiconductor device having an SRAM cell therein, said SRAM cell comprising:

a first nMOS region of a semiconductor substrate, said first nMOS region including first and third nMOS transistors therein;

a second nMOS region of the semiconductor substrate having second and fourth nMOS transistors therein;

a pMOS region disposed between said first and second nMOS regions, said pMOS region having first and second pMOS transistors therein, said first to fourth nMOS transistors and said first and second pMOS transistors being formed on the semiconductor substrate;

isolation regions between said first nMOS region and said pMOS region and between said second nMOS region and said pMOS region;

first and second bit lines extending in a direction substantially perpendicular to a longitudinal region extending from said first nMOS region to said second nMOS region; said SRAM cell further comprising a word line extending in a direction parallel to said longitudinal region, wherein said first and second nMOS transistors and said first and second pMOS transistors comprise a flip-flop for storing data, wherein said third nMOS transistor forms a first transfer gate connected between the first bit line and the flip-flop, with a gate thereof connected with said word line, and wherein said fourth nMOS transistor forms a second transfer gate connected between said second bit line and said flip-flop with a gate thereof connected with said word line.

2. A semiconductor device according to claim 1, wherein said first pMOS transistor and said first nMOS transistor are connected in series with each other between a source potential supply line and a reference potential supply line, with a gate of said first pMOS transistor and a gate of said first nMOS transistor short-circuited to each other, wherein said second pMOS transistor and said second nMOS transistor are connected in series with each other between said source potential supply line and said reference potential supply line, with a gate of said second pMOS transistor and a gate of said second nMOS transistor short-circuited to each other, wherein said third nMOS transistor is connected between said first bit line and a drain of said first nMOS transistor, wherein said fourth nMOS transistor is connected between the second bit line and a drain of said second nMOS transistor, and wherein the gate of said first pMOS transistor is connected to the drain of said second nMOS transistor and the gate of said second pMOS transistor is connected to the drain of said first nMOS transistor.

3. A semiconductor device according to claim 1, wherein said first and fourth nMOS transistors and said first pMOS transistor are each provided at a first side of said first and second nMOS regions and said pMOS region in a direction substantially perpendicular to said longitudinal region, and wherein said third and second nMOS transistors and said second pMOS transistors are each provided at a second side of said first and second regions and said pMOS region in a direction which is substantially perpendicular to said longitudinal region.

4. A semiconductor device according to claim 3, wherein said first and third nMOS transistors are arranged on the semiconductor substrate in a direction substantially perpendicular to said longitudinal region, and wherein said first and third nMOS transistors have a common n-type semiconductor area on the semiconductor substrate, and wherein said second and fourth nMOS transistors are arranged on the semiconductor substrate in a direction substantially perpendicular to said longitudinal region, and wherein said second and fourth nMOS transistors have a common n-type semiconductor area.

5. A semiconductor device according to claim 4, wherein said first pMOS transistor is disposed in an area of said pMOS region which is adjacent said first nMOS region, and wherein said second pMOS transistor is disposed in an area of said pMOS region which is adjacent said second nMOS region.

6. A semiconductor device according to claim 5, wherein a gate of said first nMOS transistor and a gate of said first pMOS transistor comprise first polysilicon wiring, said first polysilicon wiring being connected through a contact hole to the drain of said second pMOS transistor, and wherein a gate of said second nMOS transistor and a gate of said second pMOS transistor comprise second polysilicon wiring, said second polysilicon wiring being connected through a contact hole to the drain of said first pMOS transistor.

7. A semiconductor device according to claim 2, wherein an outer periphery of said SRAM cell has a rectangular shape.

8. A semiconductor device according to claim 7, wherein said source potential supply line is disposed in an area of said semiconductor substrate over said pMOS region, along a direction which is approximately perpendicular to said longitudinal region, and wherein said reference potential supply line is disposed along a side of said SRAM cell, in a direction which is substantially perpendicular to said longitudinal region, wherein said reference potential supply line and said source potential supply line define opposing sides of said rectangular shaped outer periphery.

9. A semiconductor device according to claim 8, wherein a pattern layout of the SRAM cell is symmetrical with respect to a center thereof.

10. A semiconductor device, comprising:
    a memory cell array; and
    a peripheral circuit connected to said memory cell array for performing data write and read operations for said memory cell array,
    wherein said memory cell array comprises a plurality of CMOS SRAM cells disposed in a lattice configuration, each of said plurality of CMOS SRAM cells comprising
        a first nMOS region including first and third nMOS transistors therein;
        a second nMOS region having second and fourth nMOS transistors therein;
        a pMOS region disposed between said first and second nMOS regions, said pMOS region having first and second pMOS transistors therein;
        isolation regions between said first nMOS region and said pMOS region and between said second nMOS region and said pMOS region;
        first and second bit lines extending in a direction substantially perpendicular to a longitudinal region extending from said first nMOS region to said second nMOS region; said CMOS SRAM cell further comprising
        a word line extending in a direction parallel to said longitudinal region,
    wherein said first and second nMOS transistors and said first and second pMOS transistors comprise a flip-flop for storing data, wherein said third nMOS transistor forms a first transfer gate connected between the first bit line and the flip-flop, with a gate thereof connected with said word line, and wherein said fourth nMOS transistor forms a second transfer gate connected between said second bit line and said flip-flop with a gate thereof connected with said word line.

11. A semiconductor device according to claim 10, wherein each CMOS SRAM cell has a pattern layout with an outer periphery in a rectangular shape, said pattern layout being symmetrical with respect to a center thereof.

12. A semiconductor device according to claim 11, wherein said plurality of CMOS SRAM cells comprise a first-type CMOS SRAM cell and a second-type CMOS SRAM cell, said first type and said second type cells having corresponding outer peripheries, wherein said first-type and said second-type CMOS SRAM cells are alternately arranged in blocks in a direction parallel to said bit lines and wherein outer peripheries of the first-type and said second-type CMOS SRAM cells are substantially symmetrical with respect to a boundary line between said first-type and said second-type CMOS SRAM cells which are adjacent each other.

13. A semiconductor device according to claim 12, wherein a gate of said third nMOS transistor of said first-type CMOS SRAM cell is connected to the word line corresponding to the first-type CMOS SRAM cell, wherein a gate of said fourth nMOS transistor of said second-type CMOS SRAM cell is connected by gate wiring to the gate of said third nMOS transistor of an adjacent first-type CMOS SRAM cell, wherein a gate of said fourth nMOS transistor of said first-type CMOS SRAM cell is connected to the corresponding word line, and wherein a gate of the third nMOS transistor of the second-type CMOS SRAM cell is connected by gate wiring to the gate of said fourth nMOS transistor of the adjacent first-type CMOS SRAM cell.

14. A semiconductor device according to claim 13, further comprising first and second data lines arranged parallel to said first and second bit lines for each of said CMOS SRAM cells, wherein said first and second data lines are connected to said first and second bit lines, respectively, and wherein said first and second bit lines are automatically located when said each CMOS SRAM cell is arranged, and wherein the first and second data lines are connected to data bus lines which are located between the CMOS SRAM cell blocks.

* * * * *

UNITED STATES PATENT AND TRADEMARK OFFICE
CERTIFICATE OF CORRECTION

| | | |
|---|---|---|
| PATENT NO. | : 5,744,844 | Page 1 of 1 |
| APPLICATION NO. | : 08/752631 | |
| DATED | : April 28, 1998 | |
| INVENTOR(S) | : Tsuyoshi Higuchi | |

It is certified that error appears in the above-identified patent and that said Letters Patent is hereby corrected as shown below:

IN THE CLAIMS:

Please amend the claims as follows:

Claim 1, lines 57 and 61, delete "longitudinal region" and substitute therefor -- longitudinal direction --.

Claim 3, lines 31 and lines 35-36, delete "longitudinal region" and substitute therefor -- longitudinal direction --.

Claim 4, lines 40 and 45, delete "longitudinal region" and substitute therefor -- longitudinal direction --.

Claim 8, lines 5 and 8, delete "longitudinal region" and substitute therefor -- longitudinal direction --.

Claim 10, lines 36 and 41, delete "longitudinal region" and substitute therefor -- longitudinal direction --.

Signed and Sealed this
Thirteenth Day of March, 2012

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 5,744,844 | |
| APPLICATION NO. | : 08/752631 | |
| DATED | : April 28, 1998 | |
| INVENTOR(S) | : Tsuyoshi Higuchi | |

It is certified that error appears in the above-identified patent and that said Letters Patent is hereby corrected as shown below:

IN THE CLAIMS:

Please amend the claims as follows:

Claim 1, Column 10, lines 57 and 61, delete "longitudinal region" and substitute therefor -- longitudinal direction --.

Claim 3, Column 11, lines 31 and lines 35-36, delete "longitudinal region" and substitute therefor -- longitudinal direction --.

Claim 4, Column 11, lines 40 and 45, delete "longitudinal region" and substitute therefor -- longitudinal direction --.

Claim 8, Column 12, lines 5 and 8, delete "longitudinal region" and substitute therefor -- longitudinal direction --.

Claim 10, Column 12, lines 36 and 41, delete "longitudinal region" and substitute therefor -- longitudinal direction --.

This certificate supersedes the Certificate of Correction issued March 13, 2012.

Signed and Sealed this
Seventeenth Day of April, 2012

David J. Kappos
*Director of the United States Patent and Trademark Office*